United States Patent [19]

Cook et al.

[11] Patent Number: 4,805,691

[45] Date of Patent: Feb. 21, 1989

[54] COOLING TECHNIQUE FOR COMPACT ELECTRONICS INVERTER

[75] Inventors: Alex Cook; Charles E. Lents, both of Rockford, Ill.

[73] Assignee: Sundstrand Corporation, Rockford, Ill.

[21] Appl. No.: 944,758

[22] Filed: Dec. 22, 1986

[51] Int. Cl.⁴ .................. H01L 23/42; F28D 15/02
[52] U.S. Cl. .................. 165/104.33; 165/104.26; 361/385; 357/82
[58] Field of Search .............. 165/104.26, 104.33; 361/385; 357/82

[56] References Cited

U.S. PATENT DOCUMENTS

| | | |
|---|---|---|
| 3,833,753 | 9/1974 | Garboushian . |
| 3,839,660 | 10/1974 | Stryker . |
| 3,978,518 | 8/1976 | Kessler et al. |
| 4,019,098 | 4/1977 | McCready et al. ............... 361/385 |
| 4,069,497 | 1/1978 | Steidlitz . |
| 4,168,507 | 9/1979 | Yester, Jr. . |
| 4,275,510 | 6/1981 | George ........................... 165/104.26 |
| 4,303,934 | 12/1981 | Stitt . |
| 4,327,399 | 4/1982 | Sasaki et al. ..................... 361/385 |
| 4,376,287 | 3/1983 | Sechi . |
| 4,398,208 | 8/1983 | Murano ............................ 357/81 |
| 4,524,238 | 6/1985 | Butt . |
| 4,567,505 | 1/1986 | Pease et al. . |

FOREIGN PATENT DOCUMENTS

| | | |
|---|---|---|
| 1319937 | 6/1973 | United Kingdom . |
| 1361505 | 7/1974 | United Kingdom . |
| 1365448 | 9/1974 | United Kingdom . |
| 1455002 | 11/1976 | United Kingdom . |
| 1484831 | 9/1977 | United Kingdom . |
| 1564980 | 4/1980 | United Kingdom . |
| 2167550 | 5/1986 | United Kingdom . |

Primary Examiner—Albert W. Davis, Jr.
Attorney, Agent, or Firm—Wood, Dalton, Phillips, Mason & Rowe

[57] ABSTRACT

A substrate with a heat producing electronic component is mounted directly on a heat dissipating structure. The heat dissipating structure has a closed chamber with adjacent condenser and evaporator sections and contains a supply of liquid cooling fluid with a predetermined vaporization temperature. The evaporator section is in heat transfer relation with the substrate and the electronic component thereon. A plurality of channels are strategically arranged in the surfaces bounding the chamber to move the cooling fluid by capillary action in a predetermined path between the condenser and evaporator sections in heat exchange relationship over the chamber walls to maintain the substrate at an acceptable temperature. A heat sink, in heat exchange relationship with the condenser section of the heat dissipating structure, maintains a temperature differential between the evaporator and condenser sections and assures that the condenser section is cooled sufficiently to condense the cooling fluid.

4 Claims, 1 Drawing Sheet

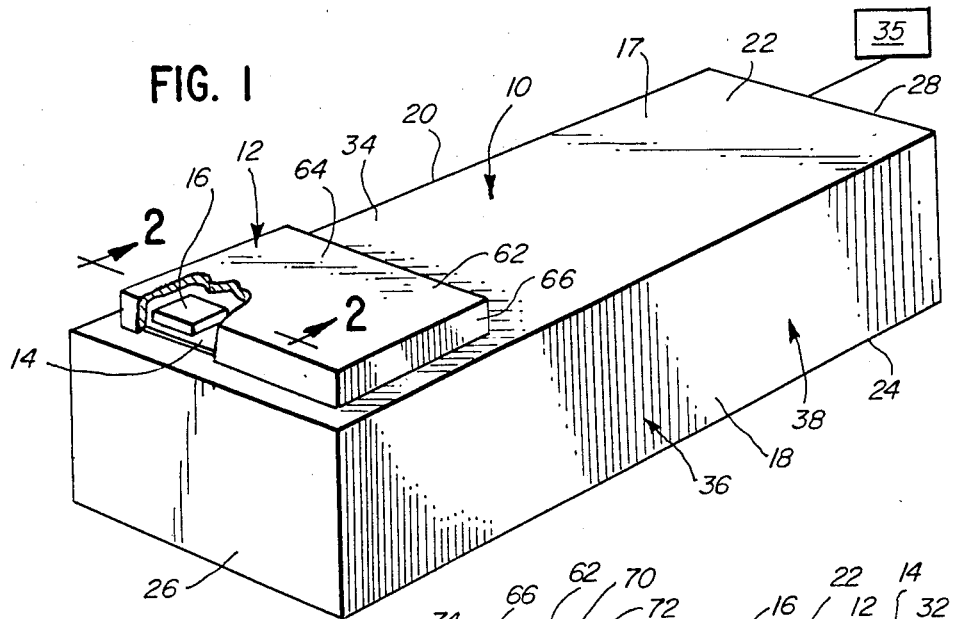

COOLING TECHNIQUE FOR COMPACT ELECTRONICS INVERTER

BACKGROUND OF THE INVENTION

1. Field of the Invention

This invention relates to cooling systems for heat producing electronic components and, more particularly, to a closed cooling system having a circulating heat exchange fluid.

2. Background Art

Designers of electronic equipment contend with the competing objectives of compacting electronic component assemblies and sufficiently cooling the assemblies to ensure optimum component performance. While it is desirable to make electronic assemblies as compact as possible, when the heat producing components are in close proximity, there often results a detrimental heat concentration which may adversely affect heat sensitive components. Dissipating the concentrated heat, thus keeping the components at low temperature and high reliability, can be difficult and thus complicated heat dissipating systems have been developed.

An exemplary prior art heat dissipating structure is shown in U.S. Pat. No. 4,398,208, to Murano et al. In Murano et al. a substrate with components thereon is mounted on a heat exchanging unit which continuously directs liquid coolant over a wall that is in heat exchange relationship with the substrate.

One drawback with the Murano et al. system is that it requires a pump to circulate the liquid. A fairly elaborate plumbing system is required to circulate the liquid from the pump in the described fashion.

SUMMARY OF THE INVENTION

The present invention is specifically directed to overcoming the above enumerated problems in a novel and simple manner.

According to the invention, a substrate with one or more heat producing electronic components is mounted directly on a heat dissipating structure. The heat dissipating structure has a closed chamber with adjacent condenser and evaporator sections and contains a supply of cooling fluid with a predetermined vaporization temperature. The evaporator section is in heat transfer relation with the substrate and the electronic component thereon while the condenser section is in heat transfer relationship with a heat sink to maintain a temperature differential between the condenser and evaporator sections. A plurality of channels are strategically arranged in the surfaces bounding the chamber to move the cooling fluid by capillary action in a predetermined path between the condenser and evaporator sections in heat exchange relationship over the chamber walls to maintain the substrate at an acceptable temperature.

Preferably, the electronic components are hermetically sealed against the substrate.

The chamber is bounded by first and second facing wall surface pairs and spaced end walls. A first plurality of continuous channels is defined in the wall surfaces of one of the wall surface pairs. A second plurality of continuous channels is defined in the wall surfaces of the other wall surface pair.

Liquid from the condenser section flows to the evaporator section and is vaporized by heat given off by the electronic component thereby cooling the electronic component and the substrate. The vapor then circulates to the condenser section of the housing, rejects heat to a heat sink, condenses and is once again drawn into the channels to repeat the cycle.

The inventive structure is simple in construction. Further, fluid circulation is self starting upon the component generating heat sufficient to raise the temperature of that portion of the heat dissipating structure to which it attaches to the vaporization temperature for the cooling fluid.

According to the invention, the chamber pressure can be lowered below atmospheric pressure to lower the vaporization temperature of the cooling fluid.

BRIEF DESCRIPTION OF THE DRAWINGS

FIG. 1 is a perspective view of a system according to the present invention comprising a heat dissipating structure with electronic components mounted thereon;

FIG. 2 is an enlarged, fragmentary, sectional view of the system along line 2—2 of FIG. 1; and FIG. 3 is a partial sectional view along the length of the system of FIG. 1.

DESCRIPTION OF THE PREFERRED EMBODIMENT

In a preferred form of the invention, a heat dissipating structure 10 is provided and has mounted directly thereto an electronic component assembly at 12. The component assembly 12 comprises a flat substrate 14 made from, for example, beryllium oxide, to which conventional heat generating electronic components 16 (one shown) are mounted. Identification of specific electronic components is not essential to understanding the invention, as the invention is intended for use with any components that are heat generating.

The heat dissipating structure comprises a housing 17 defined by spaced side walls 18, 20, top wall 22, bottom wall 24 and end walls 26, 28. The walls have inside surfaces which cooperatively bound a closed chamber 30. The walls of the heat dissipating structure 10 are formed from a heat conductive metal material and have a uniform thickness. In one embodiment the walls have a thickness of 1/16 of an inch with a length between the outside surfaces of the end walls 26, 28 of 1-1/16 inches. The cross section of the chamber is ⅛ inch by ⅜ inch. It should be understood that these dimensions are not to be read as limiting the invention.

The substrate 14 has a flat underside 32 which is placed facially against a flat upper surface 34 of the top wall 22 of the housing. The substrate can be mounted on the surface 34 adjacent either end wall 26, 28 and the choice of ends determines which end of the chamber serves as an evaporator section and which serves as a condenser section. Heat from the condenser section 38, and more specifically from the wall 28, conducts to a conventional type heat sink 35, shown schematically in FIGS. 1 and 3, from which heat is dissipated to keep the temperature of the condenser section 38 below the temperature of the evaporator section 36. In FIG. 1, the substrate is mounted adjacent end wall 26 and it is the chamber region at 36 adjacent end wall 26 that is the evaporator section of the chamber. The region at 38 adjacent the opposite end 28 of the housing 17 is the condenser section of the chamber.

A supply of cooling fluid in liquid form is placed in the chamber 30. The cooling fluid and operating pressure is chosen so that the vaporization temperature thereof is below a temperature that would be detrimental to the particular components on the substrate 14 and above the temperature to which the condenser section 38 is to be exposed.

The inside surfaces of the walls are machined to define a plurality of channels 40, 42. FIG. 2 shows the channels 40 in side wall 20 and the channels 42 and top wall 22 extending lengthwise of their respective walls. The channels in each wall are preferably U-shaped in cross section. In a preferred embodiment, the channels have a uniform cross section with a width (W in FIG. 2) of 0.02 inch and a depth (D in FIG. 2) of 0.03 inch. The preferred dimensions of the channels depend on the density of the cooling fluid. The cooling fluid and channel configuration should be chosen so that the cooling fluid moves continuously from an area of relatively higher concentration to an area of relatively low concentration by capillary action in the channels. The number of channels is principally a design consideration. The channel spacing is preferably uniform for all walls 18, 20, 22, 24 so that the wider top and bottom walls 22, 24 have more channels than the side walls 18, 20. Preferably, there are no channels in the end walls 26, 28.

FIG. 3 demonstrates the path of the cooling fluid within the chamber 30. Generally, the fluid flows in two closed loop paths. A first loop is identified by arrows 48, 50 at the upper region of the chamber and the second loop is identified by arrows 52, 54 at the lower region of the chamber.

In operation, a localized temperature increase caused by the electronic components 16 at the evaporator section 36 of the housing 17 causes the coolant to vaporize. As an incident of an increase in vapor pressure, the vapor moves toward the condenser section 38 of the housing 37. At the condenser section 38, heat is rejected through a wall 28 to the heat sink 35 and thereby dissipated. Sufficient heat is rejected to condense the coolant at the condenser section 38.

At the liquid-vapor interface, in both the evaporator and condenser sections 36, 38, a meniscus forms. Due to the difference in the radii of curvature of menisci at the evaporator section 36 and condenser section 38, a capillary pumping pressure is developed and causes the condensed liquid to flow from the condenser section 38 to the evaporator section 36 and thus a recirculating, self-sustaining flow is set up where liquid picks up heat at the evaporator section 36, resultant vapor travels towards the condenser section 38, where it rejects its heat and condenses, and resultant liquid is then pumped by capillary action to the evaporator section 36 to repeat the cycle. The heat of vaporization absorbed by the fluid at the evaporator section 36 is sufficient to effectively cool the substrate 14 and associated components 16.

The pressure in the chamber 30 can also be controlled, depending upon the operating fluid, to assure that vaporization occurs at a safe temperature for the components. For example, water might be used as the cooling fluid. By decreasing the pressure within the chamber below atmospheric pressure, the water will vaporize at a temperature sufficiently low that effective cooling of the components will result.

Preferably a casing 62 is bonded to the housing to hermetically seal the substrate 14 and the components 16. The casing 62 has an upper wall 64 and a peripheral side wall structure 66 with a bottom edge 68 that is attached to the upper surface 34 of the housing 17. The side wall 66 has an opening 70 to allow passage of an electrical conductor 72 for external connection of the components. A conventional seal 74 maintains the conductor 72 in place in the opening and seals the opening 70.

An exemplary use for the ivention system is in a power switch where a number of field effect transistors are wired in parallel, using standard techniques. Normally, the transistors would be individually packaged, mounted to a metal plate and the plate cooled. In the interest of saving space, a compact switch can be made by mounting the transistors on a single hybrid package. However, heretofore the heat dissipation systems have generally been ineffective in producing adequate cooling. By integrating the hybrid package into the inventive structure, maximum dissipation of heat and improved reliability can be achieved.

We claim:
1. In combination:
a substrate;
a plurality of individual heat producing electronic components;
means mounting each of the plurality of electronic components directly on the substrate so that each of the plurality of components is in direct heat exchange relationship with the substrate;
a heat dissipating structure being made at least partially of metal and having first and second facing wall surface pairs defining a flow chamber with first and second ends and first and second end walls spaced in a first direction for sealing the flow chamber;
a supply of cooling fluid within the flow chamber and having a predetermined vaporization temperature;
means mounting the substrate in direct heat exchange relationship with a part of the heat dissipating structure that is metal adjacent the first end of the flow chamber so that upon the dissipating structure being heated above the vaporization temperature of the cooling fluid heat is transferred to the cooling fluid to cause vaporization thereof and so that a temperature differential is established between the end walls of the heat dissipating structure;
means for causing cooling fluid vapor to move from the first chamber end towards the second chamber end so that the vapor condenses and for causing movement by capillary action of condensed vapor to the first chamber end for cooling of the heat dissipating structure adjacent the first cooling end and thereby the substrate and attached components,
said means for causing movement of condensed vapor comprising a first plurality of channels defined in each of the first and second facing wall surfaces of the one wall pair and a second plurality of channels defined in each of the first and second facing wall surfaces of the other wall pair; and
means for hermetically sealing the components and at least a portion of the substrate.
2. The combination according to claim 1 wherein said sealing means and heat dissipating structure cooperatively completely encase the substrate.
3. The combination according to claim 1 further including a heat sink externally of said heat dissipating structure and means for establishing heat exchange relationship between the heat dissipating structure and heat sink to dissipate heat from said heat dissipating structure and thereby maintain a temperature differential between the end walls of the heat dissipating structure.
4. The combination according to claim 3 wherein the pressure in the chamber is less than atmospheric pressure to enhance vaporization of cooling fluid in the chamber.

* * * * *